FULL-WAVE RECTIFYING MONOLITHIC INTEGRATED CIRCUIT

Filed May 31, 1968

INVENTOR:
JEROME R. MULLALY,
BY Robert J. Mooney
HIS ATTORNEY.

United States Patent Office 3,509,446
Patented Apr. 28, 1970

3,509,446

FULL-WAVE RECTIFYING MONOLITHIC INTEGRATED CIRCUIT

Jerome R. Mullaly, Syracuse, N.Y., assignor to General Electric Company, a corporation of New York Filed May 31, 1968, Ser. No. 733,344
Int. Cl. H02m 7/06; H01l 11/00; H03k 3/26
U.S. Cl. 321—46 4 Claims

ABSTRACT OF THE DISCLOSURE

An improved semiconductor monolithic integrated circuit is provided that employs reverse-biased diode isolation of its substrate yet is capable of operating directly from a power supply of alternating current voltage. The direct connection of an A-C power supply to the integrated circuit without disturbance of the reverse-biased diode isolation is made possible by provision of a substrate switching circuit portion in said integrated circuit. The substrate switching circuit maintains the substrate isolation diodes in an uninterrupted reverse bias mode in spite of alternations in power supply voltage polarity by preventing sufficient voltage from developing across the P/N junctions of the substrate isolation diodes to forward-bias the isolation diodes. Thus preservation of desired substrate isolation and proper operation of the remaining portions of the monolithic integrated circuit is insured throughout the entire 360° cycle of an alternating polarity power supply.

The invention relates to improvements in semiconductor circuits of monolithic integrated form. More particularly, the invention relates to an improved monolithic semiconductor integrated circuit of the type using reverse-bias diode substrate isolation, and to features thereof enabling operation of the integrated circuit directly from a power supply of alternating current voltage.

Reverse-biased diode substrate isolation is a technique or arrangement particularly useful in semiconductor monolithic integrated circuits, as is well understood by those skilled in the art, to provide desired electrical isolation of different circuit elements from each other and from the common substrate. To provide such isolation, the substrate region or portion of the semiconductor body in which the circuit elements constituting the monolithic integrated circuit are formed is normally directly connected to a substrate reference or bias point in the integrated circuit. The substrate reference point chosen is that which, in normal circuit operation is in direct connection with the most extreme potential of opposite polarity to that of the substrate conductivity type. For example, a P-type conductivity semiconductor substrate is normally in contact with a substrate reference point which is connected to the most negative potential in the circuit. When using a power supply of nonalternating polarity such as a direct current voltage power supply, a single selected substrate reference point is capable of continuously providing the desired bias for the substrate to insure uninterrupted reverse-biased diode substrate isolation. However, when an A-C power supply is used, no single substrate reference point can suffice because its potential will not remain continuously at the desired voltage extreme during all portions of the 360° cycle of the A-C supply voltage.

This means that if the substrate were tied to a single substrate reference point to create desired reverse bias diode isolation of the substrate during, say, a particular half cycle of the A-C supply, the isolation diodes provided between the substrate and each contiguous element of the integrated circuit would become forward biased during the opposite polarity portion of the A-C supply voltage cycle, with resultant chaotic effects on circuit performance. Accordingly, in the past it has been impossible to energize a monolithic integrated circuit of this type directly with the full wave of an A-C power supply, or to provide in a circuit of this type an internal or built-in full-wave rectifier.

The foregoing limitations of prior art semiconductor monolithic integrated circuits are overcome, and energization directly with the full wave of an A-C supply is made possible, by the present invention through the use of a substrate switching circuit that maintains the substrate reference point at the desired potential for effective reverse-bias diode isolation, throughout each cycle of an A-C supply. Thus the substrate isolation diodes will remain reverse-biased at all times during the entire 360° cycle of the A-C power supply.

One object of the present invention is to provide an improved semiconductor monolithic integrated circuit having reverse-bias diode substrate isolation and which can be operated in direct connection with an alternating polarity, i.e. alternating current voltage, power supply.

Another object of the present invention is to provide an improved semiconductor monolithic integrated circuit which includes an internal full-wave rectifier connectible directly to an A-C supply.

Another object of this invention is to provide a monolithic integrated circuit of the foregoing character having an internal substrate switching circuit capable of maintaining the substrate isolation diode junction in the reverse bias mode at all times during the entire 360° cycle of the A-C power supply.

Another object of this invention is to provide an integrated circuit of the foregoing character which has internal portions intended for energization by direct current voltages, yet does not require any intermediate external auxiliary circuitry to enable operation directly from an A-C power supply.

Further objects and advantages of this invention will become apparent from the following description and the accompanying drawing wherein.

To facilitate understanding of the details of circuits constructed according to the present invention, the operation of one such circuit will first be explained, with particular reference to FIGURES 1 and 2. The dotted line 50 of FIGURE 1 represents the edges of a monolithic body of semiconductor material, within which the monolithic integrated circuit of the present invention is formed.

Figure 1:
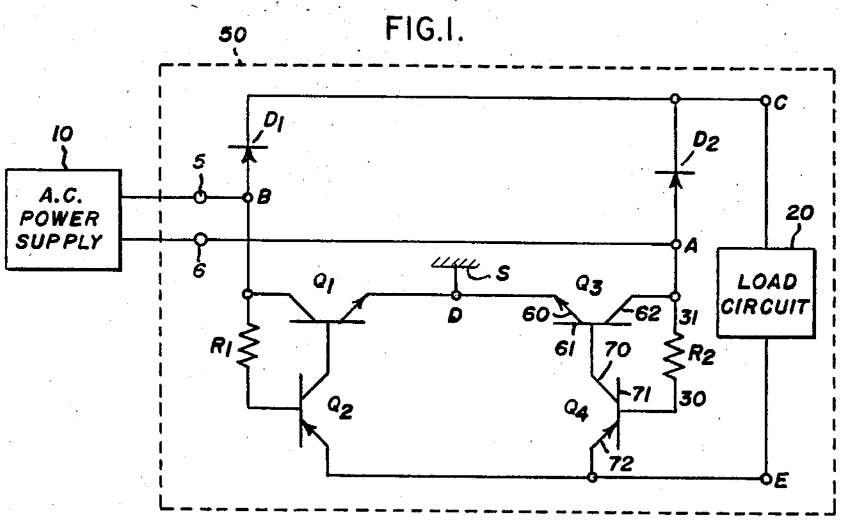
FIGURE 1 is a schematic diagram of a circuit including one form of semiconductor monolithic integrated circuit constructed according to the present invention.
Figure 2:
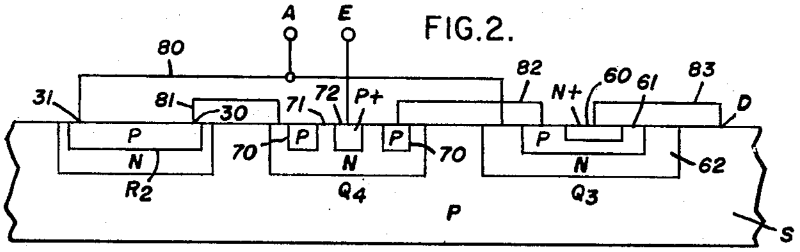
FIGURE 2 is an enlarged fragmentary sectional view of the substrate switching circuit portion of the monolithic integrated circuit shown in FIGURE 1.

The monolithic body of semiconductor material 50 includes a substrate region S which, in the embodiments of FIGURES 1 and 2, is of P-type conductivity. An A-C power supply 10, whose output may be for example an alternating current voltage of sine-shaped waveform, is directly connected to power supply input terminals 5 and 6 of the integrated circuit. The integrated circuit also includes a load circuit portion, shown by block 20 and which may be of any suitable form, its details constituting no part of the present invention. Load circuit 20 may be, by way of example and not as a limitation, a signal generator or an amplifier. Load circuit 20 is energized by a direct current voltage supplied within the integrated circuit at terminals C and E, as will hereinafter be more fully described.

Between terminals 5 and 6 and terminals C and E is provided a full wave rectifier in the monolithic integrated circuit, for converting the A-C power supplied to terminals 5 and 6 to D-C power for use by mode circuit 20. The full wave rectifier includes diodes D1 and D2, the emitter-base diode of transistor Q2 and the emitter-base diode of transistor Q4. The P-type anode of diode D1 is connected to terminal 5 and its cathode to terminal C. The P-type anode of diode D2 is connected to terminal 6 and its cathode to terminal C. The emitter of PNP transistor Q2 is connected to terminal E, and its base is connected through resistor R1 to terminal 5. The emitter of NPN transistor Q4 is connected to terminal E, and its base is connected through resistor R2 to terminal 6.

In the operation of full-wave rectifier circuit components thus far described, during the half cycle of A-C power supply 10 when terminal 5 is positive and terminal 6 negative, current will flow through D1 to terminal C, through load circuit 20, and return to terminal 6 via R2 and the emitter-base diode of Q4. When terminal 6 is positive, current will flow through D2 to terminal C, through load circuit 20, and return from terminal E to terminal 5 through R1 and the emitter-base junction of Q2. When terminal 5 is positive point A is the most negative potential point in the circuit, i.e., the point of most extreme potential of opposite polarity to the P-type conductivity of the substrate. Hence for optimum reverse-bias diode isolation of substrate S, substrate reference point D which is in direct contact with the substrate S should be connected to point A when terminal 5 is positive. But when terminal 6 is positive, point B is the most negative point in the circuit, i.e., has the most extreme potential of opposite polarity to the P-type conductivity of the substrate S. Thus for optimum reverse bias diode isolation of substrate S, substrate reference point D should be connected to point B when terminal 6 is positive. According to my invention, substrate reference point D is automatically connected to point B when terminal 6 is positive and to point A when terminal 5 is positive, as will now be described.

For purposes of discussion, assume the monolithic substrate is P-type and consider circuit terminal 5 to be positive. The input current from terminal 5 will then travel through diode D1, continue through the load circuitry 20 and return via point E. At this point, the return current passes through the emitter-base junction of transistor Q4 and reaches the base region of Q4 where it divides into two parts. One part will continue through the emitter-base junction of Q4, pass through R2 and return to terminal 6 via point A, while the other part will pass through the collector-base junction of Q4 and act as the drive current to turn on Q3. Once Q3 turns on, the drive current will pass through the collector-base junction of Q3 and then continue on to circuit terminal 6. When in the saturated mode, Q3 also acts as a current sink which absorbs all the reverse leakage and parasitic currents generated by the other circuit elements of the monolithic circuit and collected in the substrate S.

During the half cycle of the A-C supply when terminal 5 is positive relative to terminal 6, and point A is thus the most negative point in the circuit, the substrate reference point D which is in direct contact with the substrate S is held by transistor Q3 at a voltage no farther above that of point A than the emitter-to-collector saturation voltage of Q3. Since this saturation voltage is about 0.2 volt, i.e., substantially less than the approximately 0.7 volt required for the substrate isolation diodes to become forward biased, the desired substrate isolation will be maintained and performance of the integrated circuit will not be deleteriously affected by injection of charge carriers from the substrate across any of the substrate isolation diode PN junctions that could create undesirable parasitic transistor action in the circuit. During saturation of transistor Q3, Q2 will have both its junctions reverse biased, thus preventing Q1 from turning on and shunting the supply current through Q1 and Q3.

During the other half cycle of the A-C supply when circuit terminal 5 is negative and terminal 6 is positive, Q1 and Q2 will conduct and thereby hold substrate reference point D at a potential no farther above the potential of the most negative point in the integrated circuit, point B, than the saturation voltage drop of transistor Q1. $R_1$ and $R_2$, which may be, for example, about 100 ohms compensate respectively for the saturation resistance differences between the $V_{BE}$ of Q2 and $V_{BC}$ of Q1 and the $V_{BE}$ of Q4 and the $V_{BC}$ of Q3, thus maintaining either Q1 or Q3 in the conductive mode with a saturation voltage less than the threshold voltage of the substrate isolation diodes. Thus with the substrate switching circuit shown, the substrate isolation diodes of the integrated circuit will never become forward biased at any time during the entire 360° cycle of the A-C supply, even though a full-wave rectified output is provided at terminal C for energizing the remainder of the integrated circuit.

In FIGURE 2 is shown a fragmentary sectional view of the physical structure of part of the substrate switching circuit portion of the monolithic integrated circuit shown in FIGURE 1, i.e., Q3, Q4, $R_1$ and S. NPN transistor Q3 is made up of emitter region 60, base region 61 and collector region 62. PNP transistor Q4 is comprised of emitter region 72, base region 71 and collector region 70. Resistor $R_2$ is comprised of the P region between points 30 and 31. The substrate is shown as S. The electrical connections between these elements are shown by electrical leads 80, 81, 82 and 83. Lead 80 connects the terminal 31 of resistor $R_2$ to the collector region of transistor Q3. Lead 81 connects the terminal 30 of resistor $R_2$ to the base region 71 of transistor Q4. Lead 82 connects the collector region 70 of transistor Q4 to the base region 61 of transistor Q3, and lead 83 connects the emitter region 60 of Q3 to the substrate reference point D which is in direct contact with the substrate S. Points A and E in FIGURE 2 correspond to the same points in FIGURE 1 and are used to help locate the portion of FIGURE 1 shown in FIGURE 2.

Figure 3:
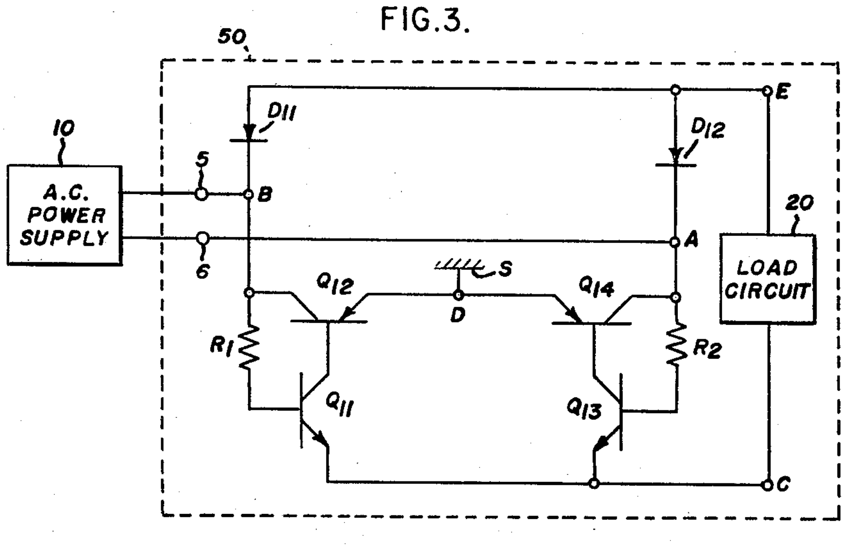
FIGURE 3 is a schematic diagram similar to FIGURE 1 showing another embodiment of a semiconductor monolithic integrated circuit constructed according to the present invention.

In FIGURE 3 is shown a schematic diagram of another embodiment of the present invention, similar to that discussed in FIGURE 1 but with the exceptions that the monolithic substrate S is of N-type conductivity, diodes D11 and D12 are substituted for D1 and D2 and are connected in the reverse mode from D1 and D2, the NPN transistors Q11 and Q13 are substituted for the PNP transistors Q2 and Q4, and the PNP transistors Q12 and Q14 are substituted for the NPN transistors Q1 and Q3.

The dotted line 50 of FIGURE 3 represents the edges of a monolithic semiconductor material, within which the monolithic integrated circuit of the present invention is formed. The monolithic body of semiconductor material 50 includes a substrate region S which, in the embodiment of FIGURE 3, is of N-type conductivity. An A-C power supply 10, whose output may be for example an alternating current voltage of sine-shaped waveform, is directly connected to power supply input terminals 5 and 6 of the integrated circuit. The integrated circuit also includes a load circuit portion, shown by block 20 and which may be of suitable form, its details constituting no part of the present invention. Load circuit 20 may be, by way of example and not as a limitation, a signal generator or an amplifier. Load circuit 20 is energized by a direct current voltage supplied within the integrated circuit at terminals C and E, as will hereinafter be more fully described.

Between terminals 5 and 6 and terminals C and E is provided a full-wave rectifier in the monolithic integrated circuit, for converting the A-C power supplied to terminals 5 and 6 to D-C power for use by mode circuit 20. The full-wave rectifier includes diodes D11 and D12, the emiter-base diode of transistor Q11 and the emitter-base diode of transistor Q13. The N-type cathode of diode D11 is connected to terminal 5 and its anode to terminal E. The N-type cathode of diode D12 is connected to terminal 6 and its anode to terminal E. The emitter of NPN transistor Q11 is connected to terminal C, and its base is connected through resistor $R_1$ to terminal 5. The emitter of NPN transistor Q13 is connected to terminal C, and its base is connected through resistor $R_2$ to terminal 6.

In the operation of full-wave rectifier circuit components thus far described. during the half cycle of A-C power supply 10 when terminal 5 is positive and terminal 6 negative, current will flow through $R_1$, through the emitter-base diode of Q11, through load circuit 20, and return to terminal 6 via D12. When terminal 6 is positive, current will flow through $R_2$, through the emitter-base diode of Q13, and return from terminal E to terminal 5 through D11. When terminal 5 is positive, point B is the most positive potential point in the circuit, i.e., the point of most extreme potential of opposite polarity to the N-type conductivity of the substrate. Hence for optimum reverse-bias diode isolation of substrate 5, substrate reference point D which is in direct contact with the substrate S should be connected to point B when terminal 5 is positive. But when terminal 6 is positive, point A is the most positive point in the circuit, i.e., has the most extreme potential of opposite polarity to the N-type conductivity of the substrate S. Thus for optimum reverse-bias diode isolation of substrate S, substrate reference point D should be connected to point A when terminal 6 is positive. According to my invention, substrate reference point D is automatically connected to point A when terminal 6 is positive and to point B when terminal 5 is positive, as will now be described.

For purpose of discussion, consider circuit terminal 5 to be positive. Thus, when a positive potential is supplied to the circuit terminal 5, the input current from terminal 5 will travel through resistor $R_1$ and into the base region of Q11 causing Q11 to conduct. The collector current of Q11 then acts as the drive current to turn on Q12. The combined Q11 currents will then pass through the emitter of Q11 and via point C continue through the load circuitry. Upon arrival at point E, it continues through diode D12 and returns to terminal 6 via point A. Once Q12 turns on, it maintains the substrate reference point D at a voltage no farther below that of terminal 5 than the collector-to-emitter saturation voltage of Q12. Since this saturation voltage is about 0.2 volt, i.e., substantially less than approximately 0.7 volt required for the substrate isolation diodes to become forward biased, the desired substrate isolation will be maintained and performance of the integrated circuit will not be deleteriously affected by injection of charge carriers from the substrate across any of the isolation diode PN junctions that could create undesirable parasitic transistor action in the circuit. During saturation of transistor Q12, Q13 will have both its junctions reverse biased, thus preventing Q14 from turning on and shunting the supply current therethrough Q12 and Q14.

During the other half cycle of the A-C supply when circuit terminal 5 of FIGURE 3 is negative and terminal

6 is positive, Q13 and Q14 will conduct and thereby hold substrate reference point D which is in direct contact with substrate S at a potential no farther below the potential of the most positive point in the integrated circuit, point A, than the saturation voltage drop of transistor Q13. $R_1$ and $R_2$, which may be, for example, about 100 ohms, compensate respectively for the saturation resistance differences between the $V_{BE}$ of Q11 and the $V_{BC}$ of Q12, and the $V_{BE}$ of Q13 and the $V_{BC}$ of Q14, thus maintaining either Q12 or Q14 in the conducting state with a saturation voltage less than the threshold voltage of the substrate isolation diodes.

Thus with the substrate switching circuit shown, the substrate isolation diodes of the integrated circuit will never, at any time during the entire 360° cycle of the A-C supply, become sufficiently forward biased to permit deleterious flow of charge carriers thereacross and resulting chaotic effects on the operation of the circuit, even though a full-wave rectified output is provided at terminal C for energizing the remainder of the integrated circuit. This is because the turning on and saturation conduction of transistor Q1 or Q3 (as the case may be) of FIGURE 1 or Q12 or Q14 (as the case may be) of FIGURE 3, connects point D to point A or point B (as the case may be) through a path of such a voltage drop (i.e., approximately 0.2 volt) that the isolation diodes never have applied across the 0.7 volt or so required for them to conduct significantly in the forward direction.

It will be appreciated by those skilled in the art that the invention may be carried out in various ways and may take various forms and embodiments other than the illustrative embodiment heretofore described. Accordingly, it is to be understood that the scope of the invention is not limited by the details of the foregoing description.

What I claim as new and desire to secure by Letters Patent of the United States is:

1. In a monolithic semiconductor integrated circuit adapted to be energized by a power supply of alternating polarity and including a body of semiconductor material having regions forming circuit elements isolated from a substrate portion of the body by PN junction isolation diodes formed between said circuit elements and said substrate portion; a substrate reference point contiguous with said substrate portion; a first bias point in said circuit having, when said power supply has one polarity, a potential more extreme than that of any of said regions and of polarity opposite to the conductivity type of said substrate portion; a second bias point in said circuit having, when said power supply has a polarity opposite to said one polarity, a potential more extreme than that of any of said regions and of polarity opposite to the conductivity type of said substrate portion; and a switching circuit forming, between said substrate reference point and said first bias point when said power supply has one polarity, and between said substrate reference point and said second bias point when said power supply has the opposite polarity, a connective path having a voltage drop less than that required to forward bias said isolation diodes, whereby said PN junction isolation diodes are prevented from becoming forward biased at any time during the entire 360° cycle of alternations of said power supply between said one and said opposite polarity.

2. A monolithic semiconductor integrated circuit as defined in claim 1 wherein said switching circuit includes first connector means extending between said substrate reference point and said first bias point and second connector means extending between said substrate reference point and said second bias point; each of said first and second connector means being switchable between an OPEN state constituting a relatively high impedance and a CLOSED state providing a path between said substrate reference point and a respective bias point having a voltage drop less than that required to forward bias said isolation diodes, and said switching circuit includes control means adapted to be responsive to alternations in the polarity of said power supply for switching said first connector means to the CLOSED state when said power supply has said one polarity and switching said second connector means to said CLOSED state when said power supply has said opposite polarity; whereby said isolation diodes are prevented from becoming forward biased sufficiently to permit deleterious flow of charge carriers thereacross at any time during the entire 360° cycle of alternations of said power supply between said one and said opposite polarity.

3. A monolithic integrated circuit as recited in claim 1 wherein at least some of said circuit elements and at least a portion of said switching circuit constitute a full-wave rectifier.

4. The circuit defined in claim 2 wherein each of said connecor means includes a switching transistor having its collector tied to a respective bias point and its emitter tied to said substrate reference point.

References Cited

UNITED STATES PATENTS

| | | | |
|---|---|---|---|
| 2,938,130 | 5/1960 | Noll. | |
| 3,159,780 | 12/1964 | Parks | 321—46 |
| 3,235,779 | 2/1966 | Zacharellis | 321—46 X |
| 3,404,321 | 10/1968 | Kurosawa et al. | |
| 3,458,798 | 7/1969 | Fang et al. | 321—43 |

LEE T. HIX, Primary Examiner

W. H. BEHA, JR., Assistant Examiner

U.S. Cl. X.R.

307—303; 317—235